US010284185B1

(12) United States Patent
Gaide et al.

(10) Patent No.: US 10,284,185 B1
(45) Date of Patent: May 7, 2019

(54) SELECTIVELY PROVIDING CLOCK SIGNALS USING A PROGRAMMABLE CONTROL CIRCUIT

(71) Applicant: Xilinx, Inc., San Jose, CA (US)

(72) Inventors: Brian C. Gaide, Erie, CO (US); Ilya K. Ganusov, San Jose, CA (US); Chi M. Nguyen, San Jose, CA (US); Robert I. Fu, Saratoga, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/845,957

(22) Filed: Dec. 18, 2017

(51) Int. Cl.
*H03K 5/15* (2006.01)
*G06F 1/10* (2006.01)
*G06F 1/12* (2006.01)
*H03K 19/096* (2006.01)
*H03K 5/00* (2006.01)

(52) U.S. Cl.
CPC ........... *H03K 5/15066* (2013.01); *G06F 1/10* (2013.01); *G06F 1/12* (2013.01); *H03K 19/096* (2013.01); *H03K 2005/00019* (2013.01)

(58) Field of Classification Search
CPC ..... H03K 5/15066; H03K 2005/00019; H03K 19/096; G06F 1/10; G06F 1/12
See application file for complete search history.

(56) References Cited

U.S. PATENT DOCUMENTS

| 7,197,659 B2* | 3/2007 | Lim .................... G06F 1/10 713/400 |
| 7,362,156 B2* | 4/2008 | Muranishi ............ G06F 1/06 327/237 |
| 9,602,082 B2 | 3/2017 | Hedayati et al. |

OTHER PUBLICATIONS

Schuriw, "Time Borrowing in Latches", Vivado Expert Series Blog, https://forums.xilinx.com/t/Vivado-Expert-Series-Blog/Time-Borrowing-in-Latches/ba-p/651529, Aug. 28, 2015, pp. 1-4, Xilinx, Inc., San Jose, CA, USA.
"Time Borrowing and Time stealing", http://ohotspot.blogspot.com/2012/09/time-borrowing-and-time-stealing.html Sep. 3, 2012, pp. 1-10.

* cited by examiner

*Primary Examiner* — Jung Kim
(74) *Attorney, Agent, or Firm* — LeRoy D. Maunu

(57) ABSTRACT

The disclosed circuit arrangements include a logic circuit, input register logic coupled to the logic circuit and including a first plurality of bi-stable circuits and a control circuit coupled to the input register logic. The control circuit is configured to generate a plurality of delayed clock signals from an input clock signal. The plurality of delayed clock signals include a first delayed clock signal and a second delayed clock signal. The control circuit selectively provides one or more of the delayed clock signals or the input clock signal to clock inputs of the first plurality of bi-stable circuits and selectively provides one or more of the delayed clock signals or the input clock signal to the logic circuit. The control circuit includes a variable clock delay logic circuit configured to equalize a clock delay to the input register logic with a clock delay to the logic circuit.

20 Claims, 6 Drawing Sheets

SELECTIVELY PROVIDING CLOCK SIGNALS USING A PROGRAMMABLE CONTROL CIRCUIT

TECHNICAL FIELD

The disclosure generally relates to fixing hold time violations and improving performance of synchronous circuits.

BACKGROUND

"Setup time" and "hold time" describe the timing requirements on the data input of a sequential logic element, such as a flip-flop or register, with respect to a clock input. The set-up and hold times define a window of time during which data must be stable to guarantee predictable performance over a full range of operating conditions and manufacturing tolerances. The setup time is the minimum amount of time that an input data signal must be held steady before a clock event, such as a rising or falling edge of a clock signal, in order for the state of the data signal to be reliably captured. Hold time is the minimum amount of time the input data signal should be held steady after the clock event in order for the state of the data signal to be reliably captured. A setup time violation, which is sometimes referred to as a long path problem, can be remedied by reducing the path length or reducing the clock speed. A hold time violation, which is sometimes referred to as a short path problem, can be remedied by increasing the path length or adding delay circuitry to the signal path.

SUMMARY

The disclosed circuit arrangements include a logic circuit, input register logic coupled to the logic circuit and including a first plurality of bi-stable circuits and a control circuit coupled to the input register logic. The control circuit is configured to generate a plurality of delayed clock signals from an input clock signal. The plurality of delayed clock signals include a first delayed clock signal and a second delayed clock signal. The control circuit selectively provides one or more of the delayed clock signals or the input clock signal to clock inputs of the first plurality of bi-stable circuits and selectively provides one or more of the delayed clock signals or the input clock signal to the logic circuit. The control circuit includes a variable clock delay logic circuit configured to equalize a clock delay to the input register logic with a clock delay to the logic circuit.

Another disclosed circuit arrangement includes a plurality of blocks of programmable logic circuitry and programmable interconnect circuitry. Each block of programmable logic circuitry is configurable to implement a logic function, and the programmable interconnect circuitry is configurable to selectively route signals between the blocks of programmable logic. Input register logic that is configurable to selectively route signals between the plurality of blocks of programmable logic is coupled to the plurality of blocks of programmable logic circuitry and includes a first plurality of bi-stable circuits. A control circuit is coupled to the input register logic. The control circuit is configured to generate a plurality of delayed clock signals from an input clock signal. The plurality of delayed clock signals include a first delayed clock signal and a second delayed clock signal. The control circuit selectively provides one or more of the delayed clock signals or the input clock signal to clock inputs of the first plurality of bi-stable circuits and selectively provides one or more of the delayed clock signals or the input clock signal to the logic circuit. The control circuit includes a variable clock delay logic circuit configured to equalize a clock delay to the input register logic with a clock delay to the logic circuit.

Other features will be recognized from consideration of the Detailed Description and Claims, which follow.

BRIEF DESCRIPTION OF THE DRAWINGS

Various aspects and features of the disclosed circuitry will become apparent upon review of the following detailed description and upon reference to the drawings in which.

DETAILED DESCRIPTION

Figure 1:
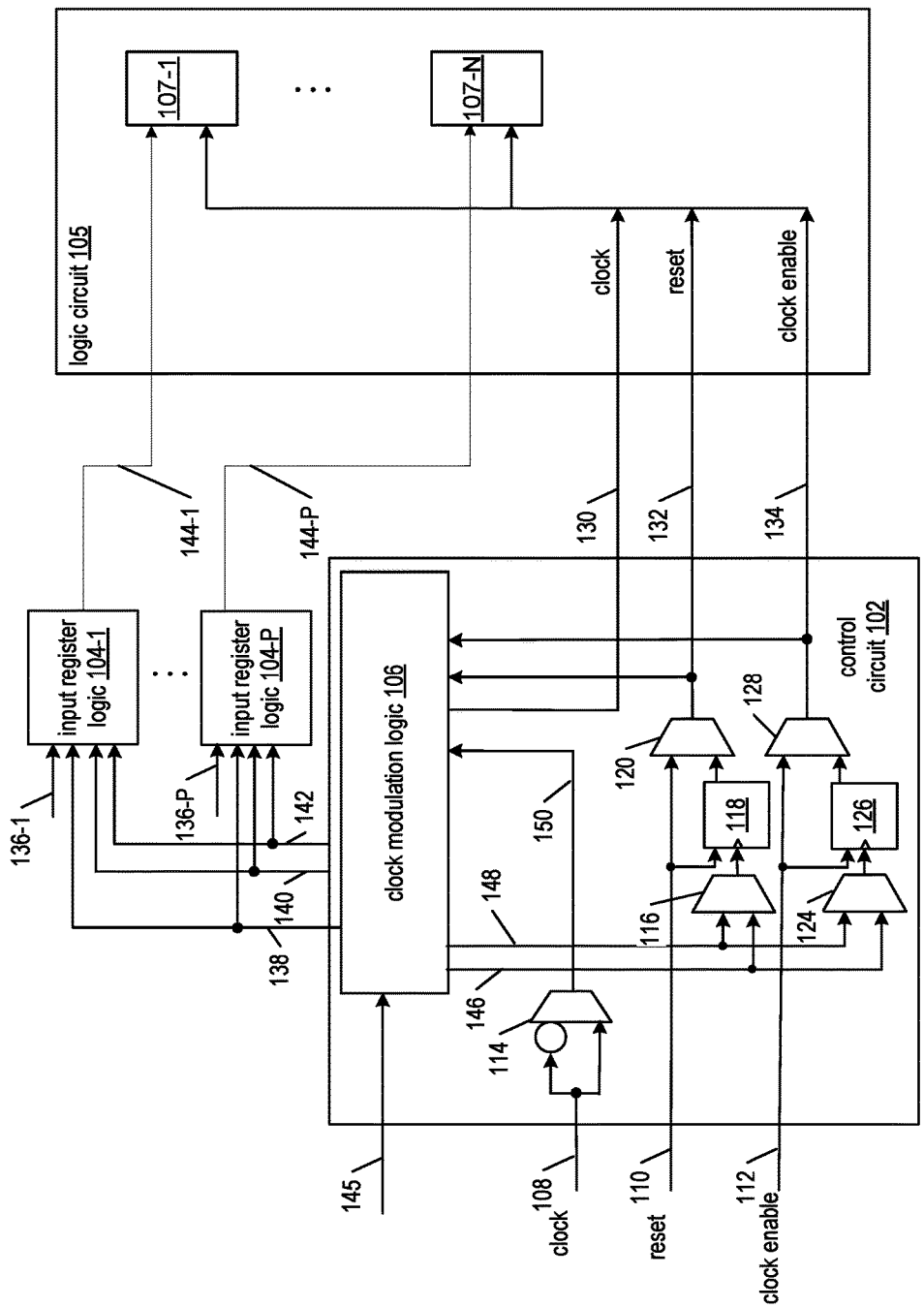
FIG. 1 shows a system having a logic circuit coupled to a control circuit and input register logic to enhance performance of the system.

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element.

The disclosed circuits and methods involve interface circuits at the inputs of blocks of logic circuitry. Each interface circuit selectively enables pipelining, selectively time borrows, and/or selectively increases delays on minimum delay paths for the inputs to a block of logic circuitry. Each block of logic circuitry can have an associated interface circuit that individually controls each bit input to the block. The interface circuit can selectively allow input data signals to bypass the interface for input to the block, selectively pipeline the input data signals before input to the block, selectively pipeline the input data signals with a delayed clock signal for time borrowing, and selectively stall fast paths to enable time borrowing on other paths.

By concentrating registers in an interface circuit near the inputs to blocks of logic circuitry and coupling the registers to clock delay elements to borrow time, much of the advantage of having pipeline registers nearly everywhere can be achieved without the high cost by forcing registers near the inputs to behave as if the registers were placed nearer the source flip-flop on a given path. The interface circuit can also be used to facilitate globally aggressive time borrowing by stalling faster data paths and to more generally fix hold violations. Because placement of the interface registers is concentrated near the inputs of the block of logic circuitry, the interface registers are more likely to share the same control set (clock, clock-enable, and reset) as the block of logic circuitry, thereby reducing the cost of enabling registers as no multiplexers are needed for selection of signals from the control set.

In an effort to improve performance of integrated circuitry, respective interface circuits are provided proximate blocks of logic circuitry. Each interface circuit includes input register logic and a control circuit. The input register logic is programmable to provide selective pipelining of input signals to a block of logic circuitry. The input register logic includes multiple bi-stable circuits. Each of the bi-stable circuits is coupled to receive an input data signal and coupled to output a data signal to an input of the block of logic circuitry. The control circuit controls the clock signal to the bi-stable circuits. The control circuit is programmable to selectively provide a delayed clock signal or the clock signal without delay to the clock input of each of the bi-stable circuits. The control circuit is also programmable to selectively connect outputs of the bi-stable circuits or signals at the data inputs of the bi-stable circuits to inputs of the block of logic circuitry.

FIG. 1 shows a system having a logic circuit 105 coupled to a control circuit 102 and input register logic 104 to enhance performance of the system. The system includes control circuit 102 coupled to input register logic 104-1, . . . , 104-P, which collectively can be referenced as input register logic 104. Each of input register logic 104-1, . . . , 104-P includes a bi-stable circuit that can be clocked separate from the bi-stable circuits each other input register logic and is discussed further in association with FIG. 2 below. Control circuit 102 includes clock modulation logic 106 that generates and selectively provides a clock signal 140, a delayed clock signal 142, and a reset signal 138 to input register logic 104. Input register logic 104 receives data signals 136-1, . . . , 136-P and outputs data signals 144-1, . . . , 144-P to logic circuit 105, which includes one or more bi-stable circuits (e.g., flip-flops) such as 107-1-107-N. Clock modulation logic 106 also generates and selectively provides a clock signal 130 to flip-flops 107-1-107-N of logic circuit 105.

Providing both a clock signal and a delayed clock signal to each of input register logic 104-1, . . . , 104-P allows all of the input data signals 136-1, . . . , 136-P to be pipelined through the input register logic and also to selectively choose which inputs will use time borrowing. This enables paths having maximum delays to satisfy timing requirements without introducing hold violations on other faster input paths. Alternatively, some input paths to the logic circuit 105 can be pipelined, and hold time violations can be fixed on other paths.

One or more instances of control circuit 102 and input register logic 104 are disposed proximate the inputs of logic circuit 105. That is, input register logic 104 is placed adjacent to logic circuit 105 on an IC die. No other logic blocks, flip-flops, memories, etc., are disposed between the input register logic and the associated logic block. Because input register logic 104 is disposed proximate the inputs of logic circuit 105, the bi-stable circuits of input register logic 104 are more likely to share a control set (clock, clock-enable, and reset) as logic circuit 105, thereby eliminating the resources needed to route the control set from a distant register to logic circuit 105. Programmable ICs, such as field programmable gate arrays (FPGAs), can have multiple instances of logic 105, and each instances of logic 105 is configurable to implement a desired logic function. Implementations having multiple instances of a logic circuit can have respective instances of control circuit 102 and input register logic 104.

Clock modulation logic 106 provides a clock signal 146 and a delayed clock signal 148, and multiplexers 116 and 124 select either clock signal 146 or delayed clock signal 148 to clock bi-stable circuits 118 and 126. Control circuit 102 includes multiplexer 120 that receives a global reset signal 110, and the output of bi-stable circuit 118 to provide a reset signal 132 to logic circuit 105. Control circuit 102 also includes multiplexer 128 that receives a global clock enable signal 112 and the output of bi-stable circuit 126 to provide a clock enable signal 134 to logic circuit 105. Control circuit 102 includes a multiplexer 114 that selects between global clock signal 108 and an inverted version of global clock signal 108 providing input clock signal 150 to clock modulation logic 106.

In at least one implementation, a global signal 145 is provided to clock modulation logic 106 to determine the initialization mode of the system. The selection of the initialization mode is based on the programming of a memory cell of clock modulation logic 106. A first initialization mode is associated with fixing hold violations of logic circuit 105. During configuration of a system, such as that illustrated in FIG. 1, the clock signals provided to input register logic 104 are forced into a state that makes the bi-stable circuits (e.g., bi-stable circuit 202 illustrated in FIG. 2) of input register logic 104 initially transparent by asserting global signal 145. After initial values have propagated to the bi-stable circuits, global signal 145 is deasserted. Control of the clock signals provided to the bi-stable circuits is returned to the local circuitry. The bi-stable circuits inherit the upstream data value from the previous stage, making them behave like an asynchronous path for proper operation on the first cycle.

A second initialization mode of the system is associated with pipelining data signals to the logic circuit 105 through the bi-stable circuits of input register logic 104. During configuration of the system, the local clock signals provided to the bi-stable circuits are forced into a particular state that makes the bi-stable circuits not transparent by asserting global signal 145. For example, global signal 145 can be a global reset signal that forces the states of the bi-stable circuits low or a global set signal that forces the states of the bi-stable circuits high. Global signal 145 is deasserted and control of the clock signals provided to the bi-stable circuits is returned to the local circuitry. The second initialization mode enables the bi-stable circuits of input logic 104 to be initialized without additional circuitry for each of the bi-stable circuits.

Although not shown in FIG. 1, logic circuit 105 can be coupled to additional bi-stable circuits. Clock modulation logic 106 can generate and selectively provide clock signal 130, reset signal 132, and/or clock enable signal 134 to the additional bi-stable circuits.

Figure 2:
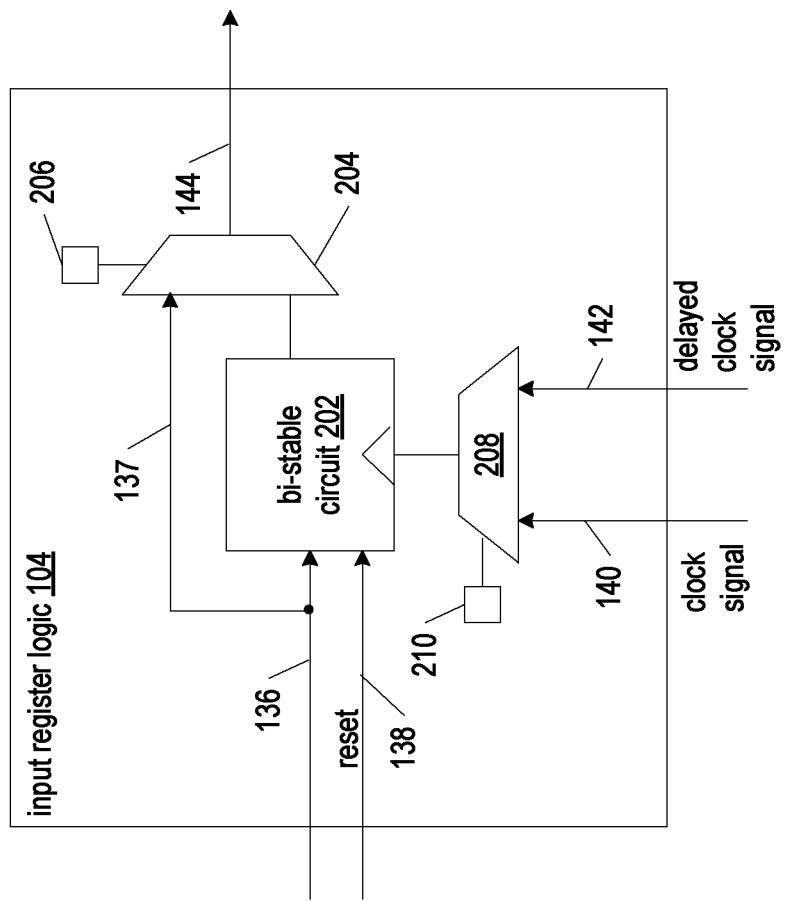
FIG. 2 shows an exemplary implementation of the input register logic of FIG. 1.

FIG. 2 shows an exemplary implementation of input register logic 104 of FIG. 1. Input register logic 104 includes a bi-stable circuit 202, along with one or more additional bi-stable circuits that are not shown. FIG. 2 illustrates the per bit circuit arrangement of input register logic 104. Bi-stable circuit 202 receives data signal 136 and reset signal 138. A clock input of bi-stable circuit 202 receives the output of multiplexer 208, which selects between clock signal 140 and delayed clock signal 142. Input register logic 104 includes a bypass path 137 such that data signal 136 is not pipelined and bypasses bi-stable circuit 202. Configuration memory cell 210 can be programmed to select the clock signal provided to bi-stable circuit 202. For example, clock signal 140 can be selectively provided to bi-stable circuit 202 when data signal 136 of a non-critical path is pipelined. Delayed clock signal 142 can be selectively provided to bi-stable circuit 202 when data signal 136 of a critical path is pipelined. As used herein, "critical path" refers to a path having a maximum delay timing violation. Configuration memory cell 206 coupled to multiplexer 204 can be programmed to select bypass path 137 when data signal 136 of the non-critical path is not pipelined or select the output of bi-stable circuit 202 when data signal 136 of the critical path is pipelined.

Figure 3:
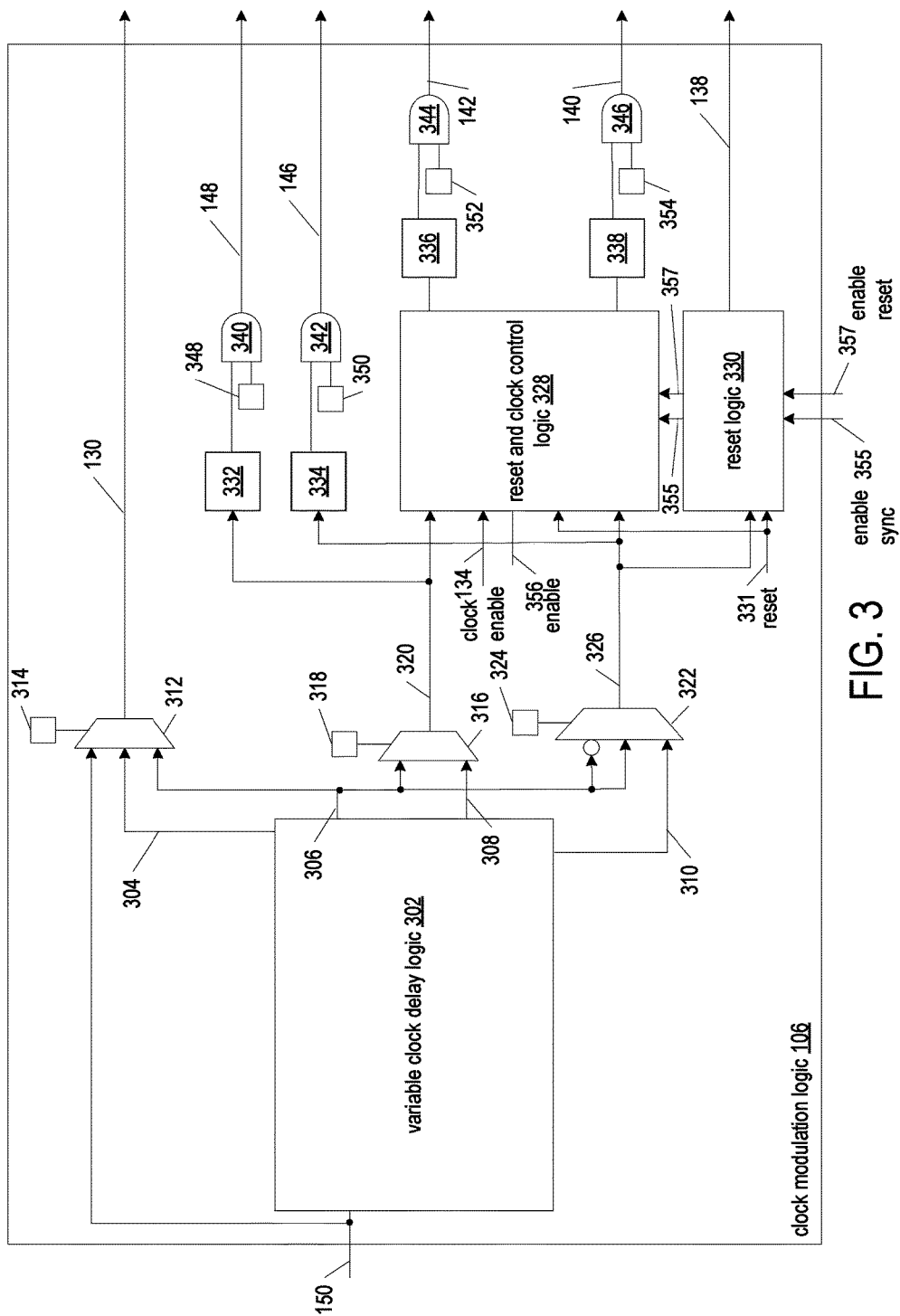
FIG. 3 shows an exemplary implementation of the clock modulation logic of the control circuit of FIG. 1.

FIG. 3 shows an exemplary implementation of clock modulation logic 106 of control circuit 102 of FIG. 1. Clock modulation logic 106 is a circuit that can be used for time borrowing, wide pulse generation for doubling of clock signals, and delaying of clock signals to input register logic 104 and downstream logic circuit 105 to avoid and/or prevent hold violations (as discussed below in association with FIG. 4). The clock signals generated by clock modulation logic 106 are sent independently to input register logic 104 and downstream logic circuit 105 so that logic circuit 105 can use a clock signal that is different from the clock signals used by input register logic 104. Clock modulation logic 106 receives input clock signal 150, which is provided to multiplexer 312 and variable clock delay logic circuit 302. Variable clock delay logic circuit 302 is discussed further in association with FIG. 4 below. Variable clock delay logic circuit 302 generates and outputs the following clock signals based on input clock signal 150: a dual edge clock signal 304, which is provided to multiplexer 312; a first delayed clock signal 306, which is provided to multiplexer 312, multiplexer 316, and multiplexer 322; a second delayed clock signal 308 (based on the first delayed clock signal 306), which is provided to multiplexer 316; and a delayed dual edge clock signal 310 (based on the first delayed clock signal 306), which is provided to multiplexer 322.

Clock signal 130 is output from multiplexer 312 to logic circuit 105. Configuration memory cell 314, which is coupled to the control terminal of multiplexer 312, can be programmed to select input clock signal 150, dual edge clock signal 304, or the first delayed clock signal 306.

Delayed clock signal 320 output from multiplexer 316 is provided to narrow pulse generator 332 and to reset and clock control logic 328. A narrow pulse generator outputs a signal having a pulse width that is less than the pulse width of the input signal. Configuration memory cell 318 is coupled to multiplexer 316 and can be programmed to select the first delayed clock signal 306 or the second delayed clock signal 308. The output of narrow pulse generator 332 is coupled to one input of AND gate 340, and configuration memory cell 348 is coupled to the other input of AND gate 340. The state of configuration memory cell 348 enables or disables the propagation of the output from narrow pulse generator 332 as the delayed clock signal 148 to bi-stable circuits 118 and 126.

The delayed clock signal 306, an inverted version of the delayed clock signal 306 (also referred to as a "negative edge clock signal"), and delayed dual edge clock signal 310 are provided as inputs to the multiplexer 322. Delayed clock signal 326 output from multiplexer 322 is provided to narrow pulse generator 334 and to reset and clock control logic 328. A negative edge clock signal is beneficial to stall incoming data for a half of a clock cycle to fix incoming hold violations. Configuration memory cell 324 is coupled to multiplexer 316 and can be programmed to select the first delayed clock signal 306, the inverted first delayed clock signal, or delayed dual edge clock signal 310. Narrow pulse generator 334 is coupled to one input of AND gate 342, and configuration memory cell 350 is coupled to the other input of AND gate 342. The state of configuration memory cell 350 enables or disables the propagation of the output from narrow pulse generator as clock signal 146 to bi-stable circuits 118 and 126.

Reset and clock control logic 328 receives base clock signal 320, delayed clock signal 326, clock enable signal 134, reset signal 331, and enable signal 356. If reset signal 331 or clock enable signal 134 are either not enabled or not asserted, the base clock signal 320 and delayed clock signal 326 pass through the reset and clock control logic 328. If reset signal 331 is asserted and enable reset signal 357 is asserted, and if enable sync signal 355 is not asserted, the base clock and delayed clock outputs are immediately forced low to shut off the input path to the bi-stable circuits in order to reset the bi-stable circuits. If reset signal 331 is asserted and enable reset signal 357 is asserted, and if enable sync signal 355 is asserted, the output base clock is forced low in the rising edge of the input base clock, and the output delayed clock is forced low on the rising edge of the input delayed clock. If the clock enable signal 134 is deasserted and enable signal 356 is asserted, the base clock signal and delayed clock signal are forced low synchronously to their own clocks.

Narrow pulse generators 336 and 338 are coupled to receive respective output signals from reset and clock control logic 328. The output of narrow pulse generator 336 is coupled to one input of AND gate 344, and the output of narrow pulse generator 338 is coupled to one input of AND gate 346. The output of configuration memory cell 352 is coupled to the other input of AND gate 344, and the output of configuration memory cell 354 is coupled to the other input of AND gate 346. The states of configuration memory cells 352 and 354 enable or disable the propagation of clock signal 140 and delayed clock signal 142 to the bi-stable circuits of input register logic 104, respectively.

Reset logic 330 receives enable sync signal 355, reset signal 331, enable reset signal 357, and signal 326. Reset logic 330 outputs reset signal 138 to the bi-stable circuits of input register logic 104. If enable reset signal 357 and enable sync signal 355 are asserted, then reset logic 330 samples reset signal 331 only on the rising edges of signal 326. If enable reset signal 357 is asserted and enable sync signal 355 is not asserted, then reset logic 330 samples reset signal 331 continuously.

Figure 4:
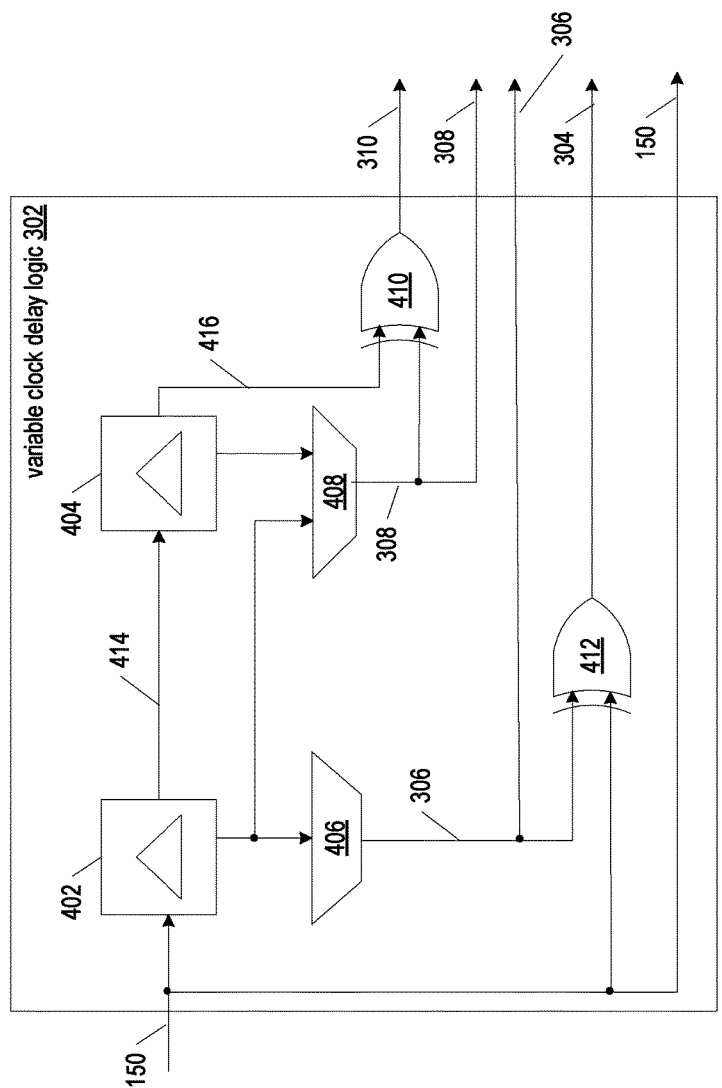
FIG. 4 shows an exemplary implementation of variable clock delay logic of the clock modulation logic of FIG. 3.

FIG. 4 shows an exemplary implementation of variable clock delay logic circuit 302 of clock modulation logic 106 of FIG. 3. Variable clock delay logic circuit 302 is a circuit that receives input clock signal 150 and generates and outputs different clock signals based on the input clock signal. Variable clock delay logic circuit 302 includes a plurality of clock paths. A first clock path includes a first delay circuit 402 that receives input clock signal 150. The first delay circuit 402 includes multiple taps that are connected to the inputs of multiplexer 406. Configuration memory cells (not shown) can be connected to the control terminal of multiplexer 406 and programmed to select the delayed version of clock signal 150 from one of the taps. The selected delayed clock signal is delayed clock signal 306.

A second clock path includes a second delay circuit 404 that receives the delayed clock signal 414. Delayed clock signal 414 is the output clock signal from the last tap of the delay circuit 402. The second delay circuit 404 includes multiple taps that are connected to the inputs of multiplexer 408. The output signals from the taps of delay circuit 402 are also connected to the inputs of the multiplexer 408. Configuration memory cells (not shown) can be connected to the control terminal of multiplexer 408 and programmed to select the delayed version of clock signal 150 from one of the taps. The selected delayed clock signal is the second delayed clock signal 308. The first and second delayed clock signals 306 and 308 can be beneficial in enabling input register logic 104 and/or logic circuit 105 to borrow time from subsequent clock cycles.

A third clock path includes a first dual edge pulse generator, which can be implemented by exclusive OR (XOR) gate 412, that receives input clock signal 150 and the first delayed clock signal 306 from multiplexer 406. XORing input clock signal 150 with the first delayed clock signal 306 generates a dual edge version of the first delayed clock signal 306 as dual edge clock signal 304. This process may be beneficial for saving power in the upstream clock tree. Dual edge clock signal 304 is selectively provided to logic circuit 105.

A fourth clock path includes a second dual edge pulse generator, such as XOR gate 410, that receives the second delayed clock signal 308 from the second delay circuit 404 and delayed clock signal 416 output from the last tap of the delay circuit 404. XORing the first delayed clock signal 308 with the delayed clock signal 416 generates a dual edge version of the second delayed clock signal 308 as delayed dual edge clock signal 310, which is selectively provided to the bi-stable circuits of input register logic 104 and/or control circuit 102. A fifth clock path outputs input clock signal 150 unmodified by variable clock delay logic circuit 302.

The hold violations at bi-stable circuits of a logic circuit, such as bi-stable circuits 107 of logic circuit 105, may be longer than the hold violations at the bi-stable circuits of the input register logic situated next to the logic circuit, such as bi-stable circuit 202 of input register logic 104. In order to enable a block of input register logic 105 to be used for both the bi-stable circuits 202 and 107, variable clock delay logic circuit 302 includes the two delay circuits 402 and 404. Delay circuit 402 generates the first delayed clock signal 306 from input clock signal 150 whereas delay circuit 404 generates the second delayed clock signal 308 from the output of the first delay circuit 402. That is, the second delayed clock signal 308 can be a further delayed version of clock signal 306. Variable clock delay logic circuit 302 coupled to input register logic 104 and logic circuit 105 can be programmed to equalize the clock delays to the bi-stable circuits of input register logic 104 with the clock delays to the bi-stable circuits of logic circuit 105. For example, control circuit 102 is programmable to selectively provide the first delayed clock signal 306 to bi-stable circuits 107 of logic circuit 105 and the second delayed clock signal 308 to bi-stable circuits 202 of input register logic 104.

Without equalization, the clock delays to the bi-stable circuits of input register logic 104 may be shorter than the clock delays to bi-stable circuits 107 to logic circuit 105. As a result, one or more data paths would need to be added to logic circuit 105 to avoid input hold violations between the bi-stable circuits of input register logic 104 and logic circuit 105. In contrast, implementations of the present disclosure enable a block of input register logic 104 to be used with blocks of logic circuit 105 of multiple sizes and with different clock delays to bi-stable circuits 107 of logic circuit 105 without having to alter the timing of logic circuit 105.

Figure 5:
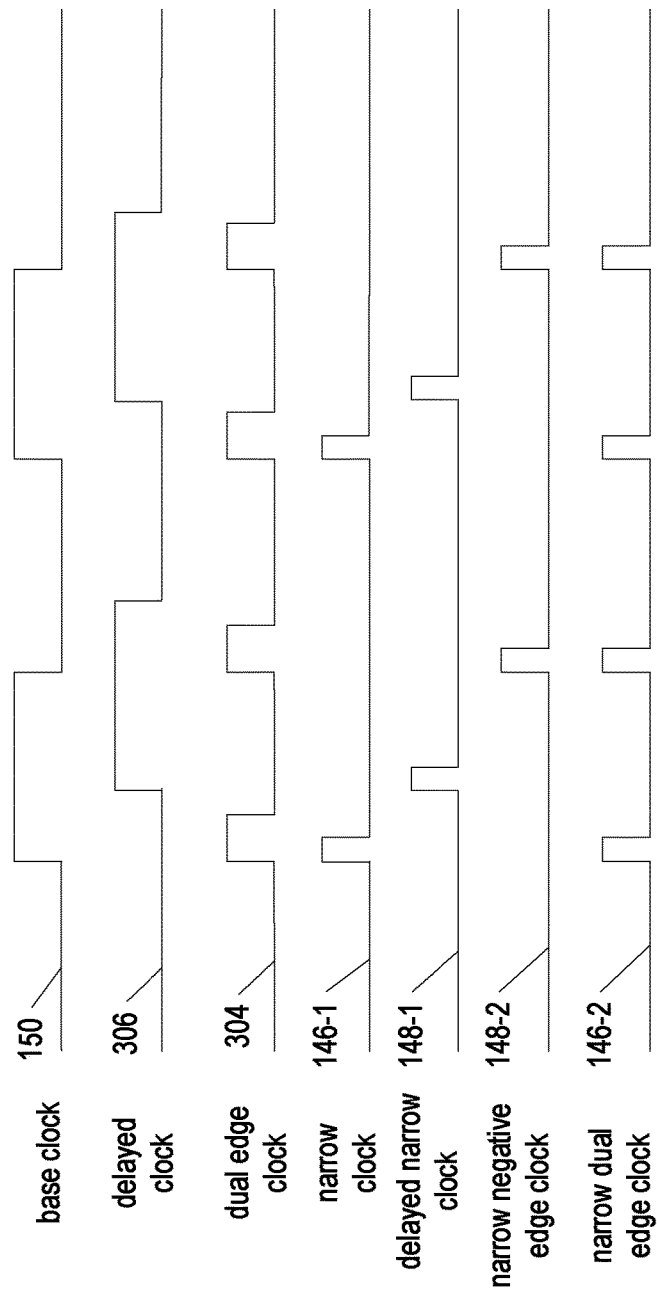
FIG. 5 shows waveforms of clock signals generated and selectively provided by the control circuit.

FIG. 5 shows waveforms of clock signals generated and selectively provided by the control circuit 102 of FIG. 1. As illustrated in FIG. 5, input clock signal 150 can be referred to as a base clock signal and the first delayed clock signal 306 can be referred to as a delayed base clock signal. The first delayed clock signal 306 can be a phase shifted version of input clock signal 150. Dual edge clock signal 304 has a rising edge at the rising and falling edges of input clock signal 150. Waveforms 146-1, 146-2, 148-1, and 148-2 represent narrow versions of input clock signal 150, the first delayed clock signal 306, an inverted (negative edge) version of input clock signal 150, and dual edge clock signal 304, respectively.

Figure 6:
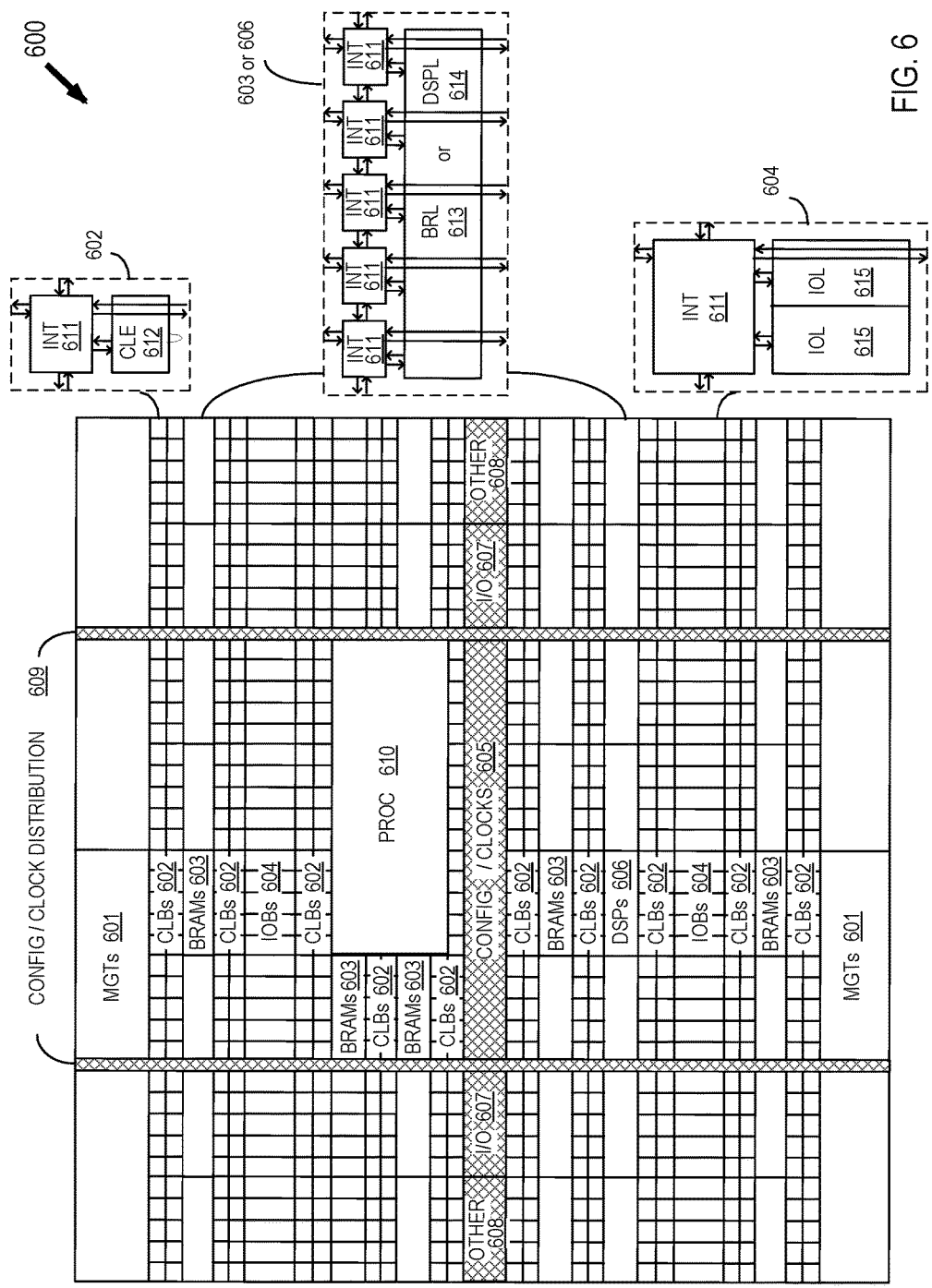
FIG. 6 shows a programmable integrated circuit (IC) on which the disclosed circuits and processes may be implemented.

FIG. 6 shows a programmable integrated circuit (IC) 600 on which the disclosed circuits and processes may be implemented. The programmable IC may also be referred to as a System On Chip (SOC) that includes field programmable gate array logic (FPGA) along with other programmable resources. FPGA logic may include several different types of programmable logic blocks in the array. For example, FIG. 6 illustrates programmable IC 600 that includes a large number of different programmable tiles including multi-gigabit transceivers (MGTs) 601, configurable logic blocks (CLBs) 602, random access memory blocks (BRAMs) 603, input/output blocks (IOBs) 604, configuration and clocking logic (CONFIG/CLOCKS) 605, digital signal processing blocks (DSPs) 606, specialized input/output blocks (I/O) 607, for example, clock ports, and other programmable logic 608 such as digital clock managers, analog-to-digital converters, system monitoring logic, and so forth. Some programmable IC having FPGA logic also include dedicated processor blocks (PROC) 610 and input and external reconfiguration ports (not shown).

In some FPGA logic, each programmable tile includes a programmable interconnect element (INT) 611 having standardized connections to and from a corresponding interconnect element in each adjacent tile. Therefore, the programmable interconnect elements taken together implement the programmable interconnect structure for the illustrated FPGA logic. The programmable interconnect element INT 611 also includes the connections to and from the programmable logic element within the same tile, as shown by the examples included at the top of FIG. 6.

For example, a CLB 602 can include a configurable logic element (CLE) 612 that can be programmed to implement user logic, plus a single INT 611. A BRAM 603 can include a BRAM logic element (BRL) 613 in addition to one or more programmable interconnect elements. Typically, the number of interconnect elements included in a tile depends on the height of the tile. The illustrated BRAM tile has the same height as five CLBs, but other numbers (e.g., four) can also be used. A DSP tile 606 can include a DSP logic element (DSPL) 614 in addition to an appropriate number of programmable interconnect elements. An 10B 604 can include, for example, two instances of an input/output logic element (IOL) 615 in addition to one instance of the INT 611. As will be clear to those of skill in the art, the actual I/O bond pads connected, for example, to the IOL 615, are manufactured using metal layered above the various illustrated logic blocks, and typically are not confined to the area of the input/output logic element 615.

A columnar area near the center of the die (shown shaded in FIG. 6) is used for configuration, clock, and other control logic. Horizontal areas 609 extending from this column are used to distribute the clocks and configuration signals across the breadth of the programmable IC. Note that the references to "columnar" and "horizontal" areas are relative to viewing the drawing in a portrait orientation.

Some programmable ICs utilizing the architecture illustrated in FIG. 6 include additional logic blocks that disrupt the regular columnar structure making up a large part of the programmable IC. The additional logic blocks can be programmable blocks and/or dedicated logic. For example, the processor block PROC 610 shown in FIG. 6 spans several columns of CLBs and BRAMs.

Note that FIG. 6 is intended to illustrate only an exemplary programmable IC architecture. The numbers of logic blocks in a column, the relative widths of the columns, the number and order of columns, the types of logic blocks included in the columns, the relative sizes of the logic blocks, and the interconnect/logic implementations included at the top of FIG. 6 are purely exemplary. For example, in an actual programmable IC, more than one adjacent column of CLBs is typically included wherever the CLBs appear, to facilitate the efficient implementation of user logic.

Though aspects and features may in some cases be described in individual figures, it will be appreciated that features from one figure can be combined with features of another figure even though the combination is not explicitly shown or explicitly described as a combination.

The disclosed circuits and methods are thought to be applicable to a variety of systems for optimizing timing of integrated circuits. Other aspects and features will be apparent to those skilled in the art from consideration of the specification. The circuits and methods may be implemented as an application specific integrated circuit (ASIC) or as programmable logic. It is intended that the specification and drawings be considered as examples only, with a true scope of the invention being indicated by the following claims.

What is claimed is:

1. A circuit arrangement, comprising:
 a logic circuit;
 input register logic including a first plurality of bi-stable circuits and a plurality of bypass circuits, each bypass circuit configured to couple either an input data signal of a respective one of the first plurality of bi-stable circuits or an output data signal of the respective one of the first plurality of bi-stable circuits, to a data input of an element of the logic circuit, respectively; and
 a control circuit coupled to the input register logic and configured to:
  generate a plurality of delayed clock signals from an input clock signal, the plurality of delayed clock signals including a first delayed clock signal and a second delayed clock signal;
  selectively provide one or more of the delayed clock signals or the input clock signal to clock inputs of the first plurality of bi-stable circuits; and
  selectively provide one or more of the delayed clock signals or the input clock signal to the logic circuit,
 wherein the control circuit includes a variable clock delay logic circuit configured to equalize a clock delay to the input register logic with a clock delay to the logic circuit.

2. The circuit arrangement of claim 1, wherein the variable clock delay logic circuit is configured to:
 generate the first delayed clock signal as a first delayed version of the input clock signal and generate the second delayed clock signal as a second delayed version of the input clock signal, wherein a delay between the first delayed clock signal and the input clock signal is less than a delay between the second delayed clock signal and the input clock signal;
 provide the first delayed clock signal to the logic circuit; and
 provide the second delayed clock signal to the input register logic.

3. The circuit arrangement of claim 1, wherein:
 the variable clock delay logic circuit includes:
  a first clock path including a first delay circuit coupled to receive the input clock signal and configured to output the first delayed clock signal; and
  a second clock path including a second delay circuit coupled to receive an output of the first delay circuit and configured to output the second delayed clock signal; and
 the control circuit is further programmable to:
  selectively provide the first delayed clock signal to the logic circuit; and
  selectively provide the second delayed clock signal to the input register logic.

4. The circuit arrangement of claim 3, wherein:
 the variable clock delay logic circuit includes:
  a third clock path including a first dual edge pulse generator coupled to receive the input clock signal and the first delayed clock signal from a first multiplexer of the variable clock delay logic circuit, the first dual edge pulse generator configured to generate a first dual edge clock signal; and
  a fourth clock path including a second dual edge pulse generator coupled to receive the second delayed clock signal from the second delay circuit and the first delayed clock signal from a second multiplexer of the variable clock delay logic, the second dual edge pulse generator configured to generate a second dual edge clock signal; and
 the control circuit is further programmable to:
  selectively provide the first dual edge clock signal to the logic circuit; and
  selectively provide the second dual edge clock signal to the input register logic.

5. The circuit arrangement of claim 4, wherein the control circuit includes:
 a first pulse generator coupled to receive, from a first multiplexer of the control circuit, the first delayed clock signal or the second delayed clock signal, wherein the first pulse generator is configured to:
  reduce a pulse width of the first delayed clock signal or the second delayed clock signal; and
  output a first narrow clock signal to the input register logic; and
 a second pulse generator coupled to receive, from a second multiplexer of the control circuit, the first delayed clock signal, an inverted clock signal, or the second dual edge clock signal, wherein the second pulse generator is configured to:
  reduce a pulse width of the first delayed clock signal, the inverted clock signal, or the second dual edge clock signal; and
  output a second narrow clock signal to the input register logic.

6. The circuit arrangement of claim 1, wherein the control circuit is further configured to:
 in a first initialization mode:
  assert a first global signal to force the clock signals to the input register logic into a state that makes the first plurality of bi-stable circuits transparent;
  deassert, subsequent to propagation of initial values to the first plurality of bi-stable circuits, the first global signal such that the first plurality of bi-stable circuits inherit an upstream data value from a previous stage; and in a second initialization mode:
assert a second global signal to force the clock signals to the input register logic into a state that makes the first plurality of bi-stable circuits not transparent;
apply a third global signal to the input register logic and the logic circuit that forces the first plurality of bi-stable circuits to a particular state; and
deassert the second global signal.

7. The circuit arrangement of claim 6, wherein the third global signal is a global reset signal that forces states of the first plurality of bi-stable circuits low.

8. The circuit arrangement of claim 1, wherein the control circuit is further programmable to selectively connect outputs of the first plurality of bi-stable circuits or signals at data inputs of the first plurality of bi-stable circuits to inputs of the logic circuit.

9. The circuit arrangement of claim 1, wherein:
the control circuit includes a second plurality of bi-stable circuits; and
the control circuit is further programmable to selectively provide one or more of the delayed clock signals or the input clock signal to clock inputs of the second plurality of bi-stable circuits.

10. The circuit arrangement of claim 1, wherein:
the input register logic includes for each input to the logic circuit, a respective data selection circuit that is programmable independent of each other respective data selection circuit to selectively connect an output of a bi-stable circuit of the first plurality of bi-stable circuits or a signal at a data input of the bi-stable circuit to an input of the logic circuit; and
the input register logic includes for each of the first plurality of bi-stable circuits, a respective clock selection circuit that is programmable independent of each other respective clock selection circuit to selectively provide one or more of the delayed clock signals or the input clock signal to a clock input of the bi-stable circuit.

11. A circuit arrangement, comprising:
a plurality of blocks of programmable logic circuitry, wherein each block of programmable logic circuitry is configurable to implement a logic function;
programmable interconnect circuitry that is configurable to selectively route signals between the plurality of blocks of programmable logic circuitry;
input register logic coupled to the plurality of blocks of programmable logic circuitry and including a first plurality of bi-stable circuits and a plurality of bypass circuits, each bypass circuit configured to couple either an input data signal of a respective one of the first plurality of bi-stable circuits or an output data signal of the respective one of the first plurality of bi-stable circuits, to a data input of an element of the programmable logic circuitry, respectively; and
a control circuit coupled to the input register logic and configured to:
generate a plurality of delayed clock signals from an input clock signal, the plurality of delayed clock signals including a first delayed clock signal and a second delayed clock signal;
selectively provide one or more of the delayed clock signals or the input clock signal to clock inputs of the first plurality of bi-stable circuits; and
selectively provide one or more of the delayed clock signals or the input clock signal to the programmable logic circuitry,
wherein the control circuit includes a variable clock delay logic circuit configured to equalize a clock delay to the input register logic with a clock delay to the programmable logic circuitry.

12. The circuit arrangement of claim 11, wherein the variable clock delay logic circuit is configured to:
generate the first delayed clock signal as a first delayed version of the input clock signal and generate the second delayed clock signal as a second delayed version of the input clock signal, wherein a delay between the first delayed clock signal and the input clock signal is less than a delay between the second delayed clock signal and the input clock signal;
provide the first delayed clock signal to the programmable logic circuitry; and
provide the second delayed clock signal to the input register logic.

13. The circuit arrangement of claim 11, wherein:
the variable clock delay logic circuit includes:
a first clock path including a first delay circuit coupled to receive the input clock signal and configured to output the first delayed clock signal; and
a second clock path including a second delay circuit coupled to receive an output of the first delay circuit and configured to output the second delayed clock signal; and
the control circuit is further programmable to:
selectively provide the first delayed clock signal to the programmable logic circuitry; and
selectively provide the second delayed clock signal to the input register logic.

14. The circuit arrangement of claim 13, wherein:
the variable clock delay logic circuit includes:
a third clock path including a first dual edge pulse generator coupled to receive the input clock signal and the first delayed clock signal from a first multiplexer of the variable clock delay logic, the first dual edge pulse generator configured to generate a first dual edge clock signal; and
a fourth clock path including a second dual edge pulse generator coupled to receive the second delayed clock signal from the second delay circuit and the first delayed clock signal from a second multiplexer of the variable clock delay logic, the second dual edge pulse generator configured to generate a second dual edge clock signal; and
the control circuit is further programmable to:
selectively provide the first dual edge clock signal to the programmable logic circuitry; and
selectively provide the second dual edge clock signal to the input register logic.

15. The circuit arrangement of claim 14, wherein the control circuit includes:
a first pulse generator coupled to receive, from a first multiplexer of the control circuit, the first delayed clock signal or the second delayed clock signal, wherein the first pulse generator is configured to:
reduce a pulse width of the first delayed clock signal or the second delayed clock signal; and
output a first narrow clock signal to the input register logic; and
a second pulse generator coupled to receive, from a second multiplexer of the control circuit, the first delayed clock signal, an inverted clock signal, or the second dual edge clock signal, wherein the second pulse generator is configured to:

reduce a pulse width of the first delayed clock signal, the inverted clock signal, or the second dual edge clock signal; and output a second narrow clock signal to the input register logic.

16. The circuit arrangement of claim 11, wherein the control circuit is further configured to:

in a first initialization mode:

assert a first global signal to force the clock signals to the input register logic into a state that makes the first plurality of bi-stable circuits transparent;

deassert, subsequent to propagation of initial values to the first plurality of bi-stable circuits, the first global signal such that the first plurality of bi-stable circuits inherit an upstream data value from a previous stage; and in a second initialization mode:

assert a second global signal to force the clock signals to the input register logic into a state that makes the first plurality of bi-stable circuits not transparent;

apply a third global signal to the input register logic and the programmable logic circuitry that forces the first plurality of bi-stable circuits to a particular state; and deassert the second global signal.

17. The circuit arrangement of claim 16, wherein the third global signal is a global reset signal that forces states of the first plurality of bi-stable circuits low.

18. The circuit arrangement of claim 11, wherein the control circuit is further programmable to selectively connect outputs of the first plurality of bi-stable circuits or signals at data inputs of the first plurality of bi-stable circuits to inputs of the programmable logic circuitry.

19. The circuit arrangement of claim 11, wherein:

the control circuit includes a second plurality of bi-stable circuits; and the control circuit is further programmable to selectively provide one or more of the delayed clock signals or the input clock signal to clock inputs of the second plurality of bi-stable circuits.

20. The circuit arrangement of claim 11, wherein:

the input register logic includes for each input to the logic circuit, a respective data selection circuit that is programmable independent of each other respective data selection circuit to selectively connect an output of a bi-stable circuit of the first plurality of bi-stable circuits or the signal at a data input of the bi-stable circuit to an input of the programmable logic circuitry; and the input register logic includes for each of the first plurality of bi-stable circuits, a respective clock selection circuit that is programmable independent of each other respective clock selection circuit to selectively provide one or more of the delayed clock signals or the input clock signal to a clock input of the bi-stable circuit.

* * * * *